United States Patent
Yoshimatsu et al.

(10) Patent No.: US 6,985,395 B2
(45) Date of Patent: Jan. 10, 2006

(54) SEMICONDUCTOR MEMORY DEVICE AND METHOD OF TESTING THE DEVICE

(75) Inventors: Takanori Yoshimatsu, Kamakura (JP); Takehiko Hojo, Yokohama (JP); Kaoru Tokushige, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 26 days.

(21) Appl. No.: 10/884,105

(22) Filed: Jul. 1, 2004

(65) Prior Publication Data
US 2005/0068816 A1   Mar. 31, 2005

(30) Foreign Application Priority Data
Sep. 25, 2003   (JP)   ............... 2003-334104

(51) Int. Cl.
*G11C 7/00*   (2006.01)
(52) U.S. Cl. ............ 365/210; 365/189.07; 365/189.12; 365/200; 365/225.7
(58) Field of Classification Search ............... 365/201, 365/200, 189.07, 225.7, 189.12
See application file for complete search history.

(56) References Cited

U.S. PATENT DOCUMENTS 6,032,274 A * 2/2000 Manning .................... 714/718
6,141,286 A * 10/2000 Vo et al. ................. 365/230.03

FOREIGN PATENT DOCUMENTS

JP   2001-256798   9/2001

OTHER PUBLICATIONS

Toshiba Digital Integrated Circuit Technical Data (TC528257J/SZ/FT-70, TC528257J/SZ/FT-80, dated May 18, 1994.
Toshiba CMOS Memory Data Book, Toshiba Corporation, 1996, p. 92.

* cited by examiner

*Primary Examiner*—Son T. Dinh
(74) *Attorney, Agent, or Firm*—DLA Piper Rudnick Gray Cary US LLP (57) ABSTRACT

A semiconductor memory device is disclosed, which includes a memory cell array including memory cells arranged in rows and columns, a word line, a bit line, a row decoder and a column decoder, a sense amplifier provided for each of the columns of the memory cell array, a write latch circuit configured to store externally input data and sets data of one row of the memory cell array in the sense amplifiers in test mode, a read latch circuit configured to store data of one row, which is read from the memory cell array and set in the sense amplifiers in test mode, a first comparison circuit configured to compare the data stored in the write latch circuit and the data stored in the read latch circuit, and a first comparison result register configured to store a comparison result of the first comparison circuit.

22 Claims, 10 Drawing Sheets

SEMICONDUCTOR MEMORY DEVICE AND METHOD OF TESTING THE DEVICE

CROSS-REFERENCE TO RELATED APPLICATIONS

This application is based upon and claims the benefit of priority from prior Japanese Patent Application No. 2003-334104, filed Sep. 25, 2003, the entire contents of which are incorporated herein by reference.

BACKGROUND OF THE INVENTION

1. Field of the Invention

The present invention relates to a semiconductor memory device and a method of testing the semiconductor memory device.

2. Description of the Related Art

To test a semiconductor memory device such as a dynamic semiconductor memory (DRAM) under manufacture, conventionally, data was sequentially written to/read from all address regions in rows and columns of a memory cell array, and an external tester received the read data to determine whether it shows Pass or Fail. This test was conducted at once for data corresponding to the number of data input/output lines or in units of data input/output bits. The number of data input/output lines is 4, 8, 16, . . . in a versatile DRAM of, e.g., 512 Mbits and it is 128, . . . in a DRAM of, e.g., 32 Mbits, which is embedded in a logic LSI.

With a considerable increase in capacity, however, an address region increases in storage space and accordingly test time is remarkably lengthened. This problem will be more serious.

The inventors of the present application have achieved a flash write technology in a multiport dynamic semiconductor memory (multiport DRAM) used in an image memory ("Toshiba CMOS Memory Data Book," Toshiba Corporation, 1996, p.92). The flash write technology allows image data to be transferred at once to one row of the memory in write mode.

BRIEF SUMMARY OF THE INVENTION

According to an aspect of the present invention, there is provided a semiconductor memory device comprising:

a memory cell array including memory cells arranged in rows and columns;

a word line connected in common to memory cells in each of rows of the memory cell array;

a bit line connected in common to memory cells in each of columns of the memory cell array;

a row decoder and a column decoder configured to select a row and a column of the memory cell array;

a sense amplifier provided for each of the columns of the memory cell array;

a write latch circuit configured to store externally input data and sets data of one row of the memory cell array in the sense amplifiers in test mode;

a read latch circuit configured to store data of one row, which is read from the memory cell array and set in the sense amplifiers in test mode;

a first comparison circuit configured to compare the data stored in the write latch circuit and the data stored in the read latch circuit; and a first comparison result register configured to store a comparison result of the first comparison circuit.

According to another aspect of the present invention, there is provided a semiconductor memory device comprising:

a memory cell array including memory cells arranged in rows and columns;

a word line connected in common to memory cells in each of rows of the memory cell array;

a bit line connected in common to memory cells in each of columns of the memory cell array;

a row decoder and a column decoder configured to select a row and a column of the memory cell array;

a sense amplifier provided for each of the columns of the memory cell array;

a storage unit arranged in the memory cell array and configured to store pattern data the bit number of which is equal to that of the sense amplifiers;

a pattern selecting decoder configured to select one of the pattern data stored in the storage unit in test mode;

a write latch circuit configured to store the pattern data selected by the pattern selecting decoder and sets the pattern data in the sense amplifiers in test mode as one row of the memory cell array;

a read latch circuit configured to store data of one row, which is read from the memory cell array and set in the sense amplifiers in test mode;

a first comparison circuit configured to compare the data stored in the write latch circuit and the data stored in the read latch circuit; and a first comparison result register configured to store a comparison result of the first comparison circuit.

According to a further aspect of the present invention, there is provided a method of testing a semiconductor memory device, comprising:

writing input data to a write latch circuit, transferring the data to a sense amplifier from the write latch circuit, and writing the data to a memory cell array row by row, the memory cell array including memory cells arranged in rows and columns;

retaining the data written in the write latch circuit as it is or rewriting the data in the write latch circuit to an externally inputted data, reading data from the memory cell array row by row to the sense amplifier, and transferring the data read to the sense amplifier to a read latch circuit;

comparing the data of the read latch circuit and the data of the write latch circuit and storing a comparison result in a first comparison register;

transferring contents stored in the first comparison result register in a test cycle to a second comparison result register in a next test cycle;

comparing the comparison result stored in the first comparison result register and the comparison result stored in the second comparison result register by a second comparison circuit and storing a comparison result in a third comparison result register; and determining whether a defective row is present or not in the memory cell array based on the contents of the first comparison result register and determining whether a defective column is present or not in the memory cell array based on the contents of the second comparison result register.

DETAILED DESCRIPTION OF THE INVENTION

[First Embodiment]

Figure 1:
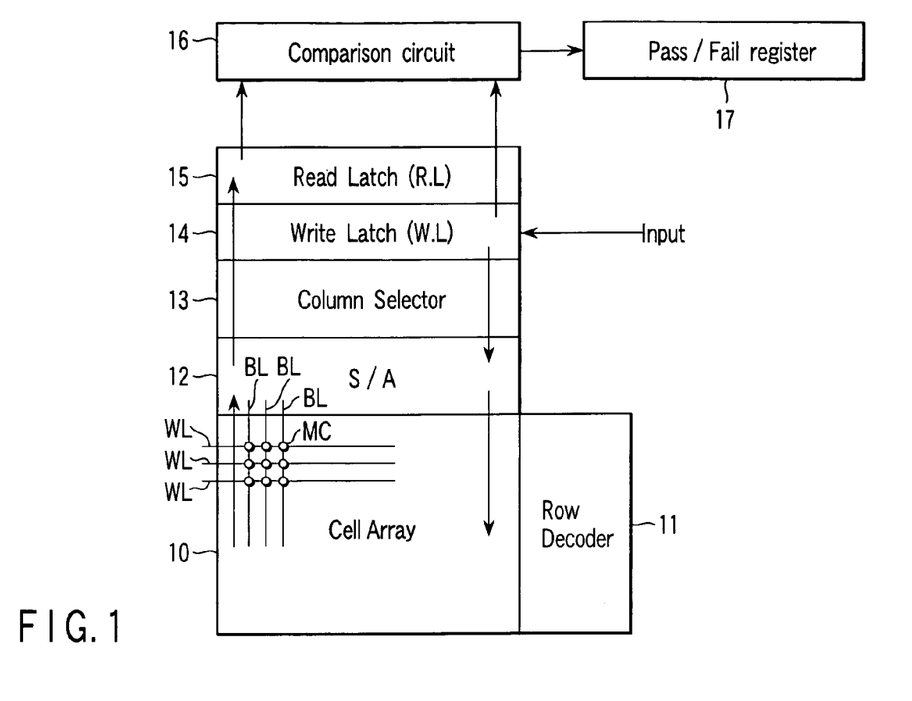
FIG. 1 is a block diagram showing part of a DRAM according to a first embodiment of the present invention.

FIG. 1 is a block diagram showing part of a DRAM according to a first embodiment of the present invention.

The DRAM includes a memory cell array 10 in which memory cells MC are arranged in rows and columns. A word line WL is connected in common to memory cells in each of rows in the memory cell array and a bit line BL is connected in common to memory cells in each of columns in the memory cell array. None of the other figures show memory cells MC, word lines WL or bit lines BL for the sake of brevity.

The DRAM includes a row decoder 11 for selecting a row of the memory cell array, a sense amplifier 12 provided for each of the columns of the memory cell array, and a column selector 13 for selecting a column of the memory cell array. The column selector 13 is selectively controlled by a column decoder.

The DRAM also includes a write latch circuit 14 provided for each sense amplifier 12. The write latch circuit 14 stores externally input data and sets data of one row in the sense amplifier 12 in test mode. The DRAM also includes a read latch circuit 15 provided for each sense amplifier 12. The read latch circuit 15 stores data of one row read out to the sense amplifier 12 from the memory cell array 10 in test mode. The sense amplifier 12, the write latch circuit 14 and the read latch circuit 15 are configured by, for example, a flip-flop circuit.

Reference numeral 16 indicates a comparison circuit 16 for comparing data stored in the write latch circuit 14 and data stored in the read latch circuit 15 and then outputting a comparison result (coincidence/noncoincidence) as a pass/ fail signal. Reference numeral 17 indicates a comparison result register (pass/fail register) for storing comparison results of the comparison circuit 16.

Furthermore, the DRAM includes groups of switching elements (not shown) for controlling interconnections between the sense amplifier 12, write latch circuit 14 and read latch circuit 15 in each bit line BL of the memory cell array 10.

The switching elements are formed of MOS transistors and include:

(1) first switching elements for selectively connecting corresponding sense amplifiers 12 to corresponding bit lines in the memory cell array 10, the first switching elements being controlled to supply data of one row read out of the memory cell array 10 to the sense amplifiers 12 of all the columns in test mode, and the first switching elements being controlled to supply data read out of a selected cell of the memory cell array 10 through a bit line to its corresponding sense amplifier 12 in normal operation mode;

(2) second switching elements for selectively connecting corresponding write latch circuits 14 to corresponding sense amplifiers 12, the second switching elements being controlled to supply data of one row stored in the write latch circuits 14 to the sense amplifiers 12 of all the columns in test mode, and the second switching elements being controlled to selectively connect some of the write latch circuits 14 to the corresponding sense amplifier 12 in normal operation mode;

(3) third switching elements for selectively connecting corresponding sense amplifiers 12 to corresponding read latch circuit 15, the third switching elements being controlled to supply data of one row read out to the sense amplifiers 12 to the read latch circuits 15 in test mode, and the third switching elements being controlled to selectively connect some of the sense amplifiers 12 to the corresponding read latch circuits 15 in normal operation mode; and (4) fourth switching elements for selectively connecting corresponding write latch circuits 14 and corresponding read latch circuits to the comparison circuit 16, and the fourth switching elements being controlled to connect the write latch circuits 14 and the read latch circuits 15 to the comparison circuit 16 at least in normal operation mode.

Figure 2:
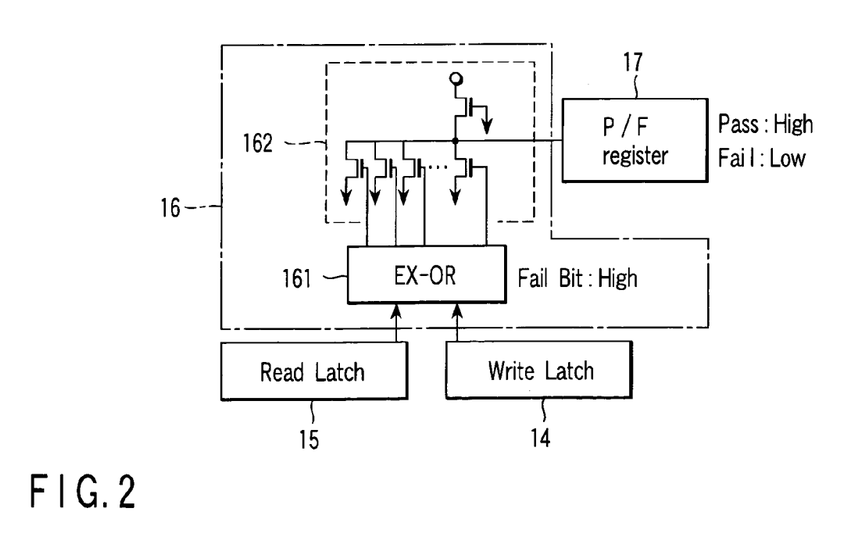
FIG. 2 is a circuit diagram showing an example of a comparison circuit of the DRAM shown in FIG. 1.

FIG. 2 shows an example of the comparison circuit 16 shown in FIG. 1.

The comparison circuit 16 includes an exclusive-OR (EX-OR) circuit 161 and a NOR circuit 162. The EX-OR circuit 161 compares data stored in the write latch circuit 14 and data stored in the read latch circuit 15 for each bit and outputs a high-level signal when these data do not coincide with each other. The NOR circuit 162 receives a comparison signal of the bits from the EX-OR circuit 161 and outputs a pass/fail signal to the pass/fail (P/F) register 17.

Examples of an operation (a method) of testing a memory according to the first embodiment will now be described with reference to FIGS. 1 and 2.

Operation Example 1

First, input data is externally supplied and written to the write latch circuit 14 and transferred to the sense amplifier 12. The data is written to the memory cell array 10 row by row.

Prior to an operation of reading data of row address in a test cycle, the same data as the above input data is externally supplied and written (i.e., rewritten) to the write latch circuit 14 as comparison data. Then, data of one row selected from the memory cell array is read to the sense amplifier 12 and transferred to the read latch circuit 15.

The first comparison circuit 16 compares the contents of the write latch circuit 14 and those of the read latch circuit 15. The pass/fail (P/F) register 17 stores a result of the comparison. After that, the contents of the pass/fail (P/F) register 17 are read out through an external tester (not shown) after the test of data for the row is completed to determine whether the row is defective or not.

Operation Example 2

Operation example 2 differs from above operation example 1 in the following point. Prior to a read operation, the contents of the latch circuit 14 are not rewritten to comparison data, but the data stored and held in the write latch circuit 14 is used as comparison data.

According to above operation examples 1 and 2, data of one row can be tested at once. Hence, test time can greatly be reduced to 1/M (where M is the number of column addresses) that of the above-described conventional memory.

[Second Embodiment]

Figure 3:
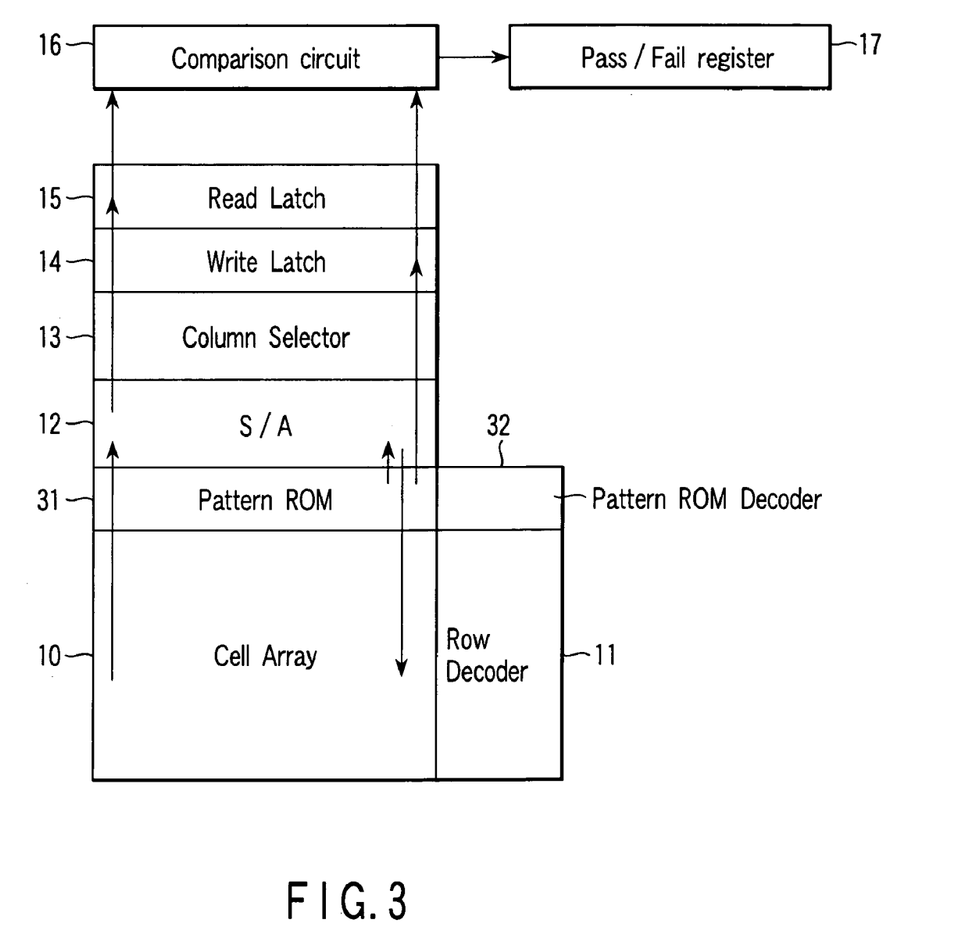
FIG. 3 is a block diagram showing part of a DRAM according to a second embodiment of the present invention.

FIG. 3 is a block diagram showing part of a DRAM according to a second embodiment of the present invention.

The same components as those of the first embodiment are denoted by the same reference numerals and their descriptions are omitted.

The DRAM of the second embodiment differs from that of the first embodiment in the following points.

(1) A storage unit (pattern ROM in the present second embodiment) 31 is added to the memory cell array 10 to store pattern data the number of which is equal to that of sense amplifiers 12. A pattern selecting decoder (pattern ROM decoder in the present second embodiment) 32 is also added to the memory cell array 10 in test mode to select one of pattern data of the storage unit 31.

The pattern ROM 31 includes a MOS transistor (not shown) for each pattern data. The MOS transistor is connected to both each of bit lines of the memory cell array 10 and a first potential Vdd (high level) or a second potential GND (low level). When pattern data is selected, a MOS transistor of each column corresponding to the selected pattern data turns on and a high or low level is set in each column.

(2) In test mode, the write latch circuit 14 stores pattern data selected by the pattern ROM decoder 32 and sets it in the sense amplifier 12 as data for one row of the memory cell array.

The DRAM according to the second embodiment is also able to perform an operation that conforms to the above operations of the DRAM according to the first embodiment in test mode.

[Third Embodiment]

Figure 4:
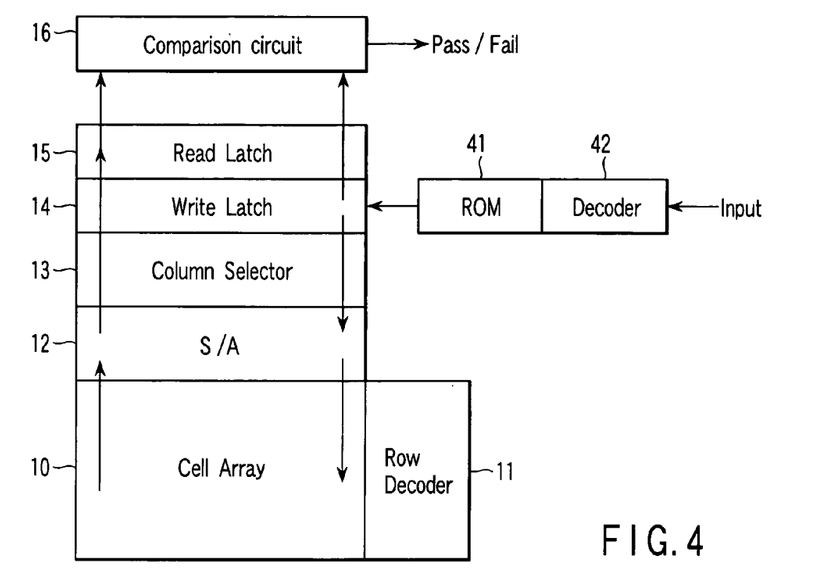
FIG. 4 is a block diagram showing part of a DRAM according to a third embodiment of the present invention.

FIG. 4 is a block diagram showing part of a DRAM according to a third embodiment of the present invention.

The same components as those of the first embodiment are denoted by the same reference numerals and their descriptions are omitted.

The DRAM of the third embodiment differs from that of the first embodiment in the following points.

(1) A storage unit (e.g., a fixed data ROM) 41 and a pattern selecting decoder 42 are added to the DRAM device. The storage unit 41 and the pattern selecting decoder 42 are provided outside the memory cell array 10. The pattern selecting decoder 42 selects one of pattern data of the storage unit 41 in test mode.

(2) In test mode, the write latch circuit 14 stores pattern data selected by the pattern selecting decoder 42 and sets the pattern data in the sense amplifier 12 as data for one row of the memory cell array 10.

The DRAM according to the third embodiment is also able to perform an operation that conforms to the above operations of the DRAM according to the first embodiment in test mode.

[Fourth Embodiment]

Figure 5:
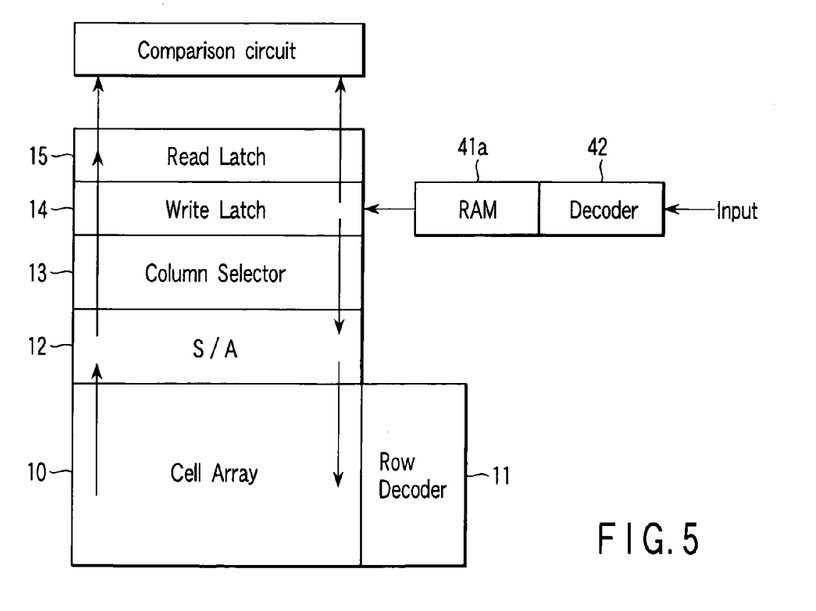
FIG. 5 is a block diagram showing part of a DRAM according to a fourth embodiment of the present invention.

FIG. 5 is a block diagram showing part of a DRAM according to a fourth embodiment of the present invention.

The same components as those of the first embodiment are denoted by the same reference numerals and their descriptions are omitted.

The DRAM of the fourth embodiment differs from that of the first embodiment in the following point.

A storage unit 41a and a pattern selecting decoder 42 are added to the DRAM device. The storage unit 41a and the pattern selecting decoder 42 are provided outside the memory cell array 10. The storage unit 41a includes a RAM for storing a plurality of pattern data that are externally supplied. The pattern selecting decoder 42 selects one of pattern data of the storage unit 41a in test mode.

The DRAM according to the fourth embodiment is also able to perform an operation that conforms to the above operations of the DRAM according to the first embodiment in test mode. Furthermore, since the RAM of the storage unit 41a can store arbitrary pattern data, the DRAM can be tested by the pattern data.

[Fifth Embodiment]

Figure 6:
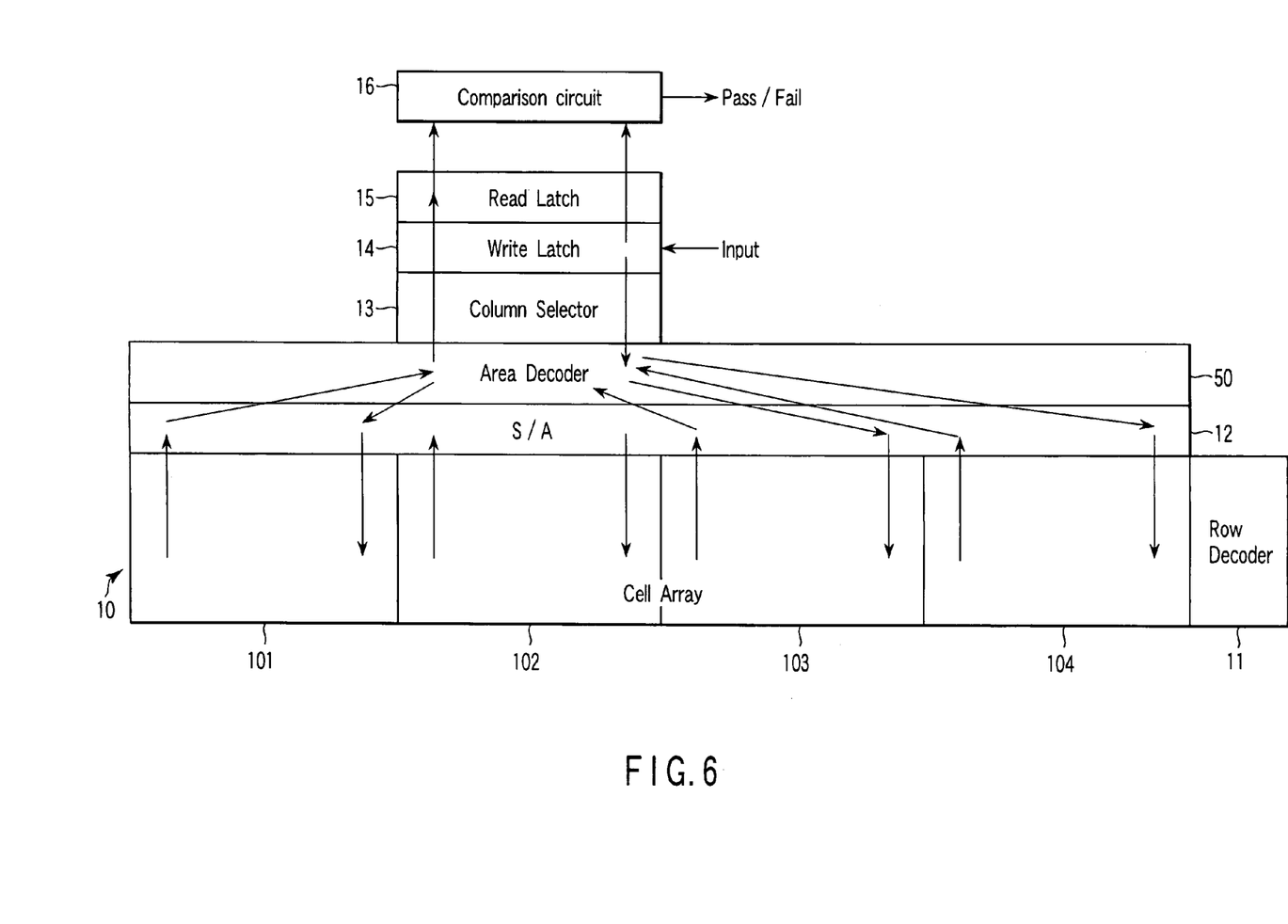
FIG. 6 is a block diagram showing part of a DRAM according to a fifth embodiment of the present invention.

FIG. 6 is a block diagram showing part of a DRAM according to a fifth embodiment of the present invention.

The DRAM of the fifth embodiment differs from that of the first embodiment in the following points. The memory cell array 10 is divided into n sub-cell arrays 101 to 104 (n is a positive integer and equal to four in the present fifth embodiment). The number of write latch circuits 14, that of read latch circuits 15 and that of comparison circuits 16 are each equal to 1/n that of sense amplifiers 12. The DRAM includes an area decoder 50 for selecting a sub-cell array. However, the DRAM of the fifth embodiment is the same as that of the first embodiment in that the number of sense amplifiers 12 is equal to that of columns of the memory cell array 10. The same components as those of the first embodiment are denoted by the same reference numerals and their descriptions are omitted.

The write latch circuit 14 stores input data externally supplied and, in test mode, sets data for one row of the sub-cell array selected by the area decoder 50 in the sense amplifier 12 corresponding to the selected sub-cell array. The read latch circuit 15 stores, in test mode, data of one row read out to the sense amplifier 12 from the corresponding sub-cell array selected by the area decoder 50. After the test of data for the row is completed, it is determined whether the row is defective or not.

The DRAM according to the fifth embodiment is also able to perform an operation that conforms to the above operations of the DRAM according to the first embodiment in test mode.

[Sixth Embodiment]

Figure 7:
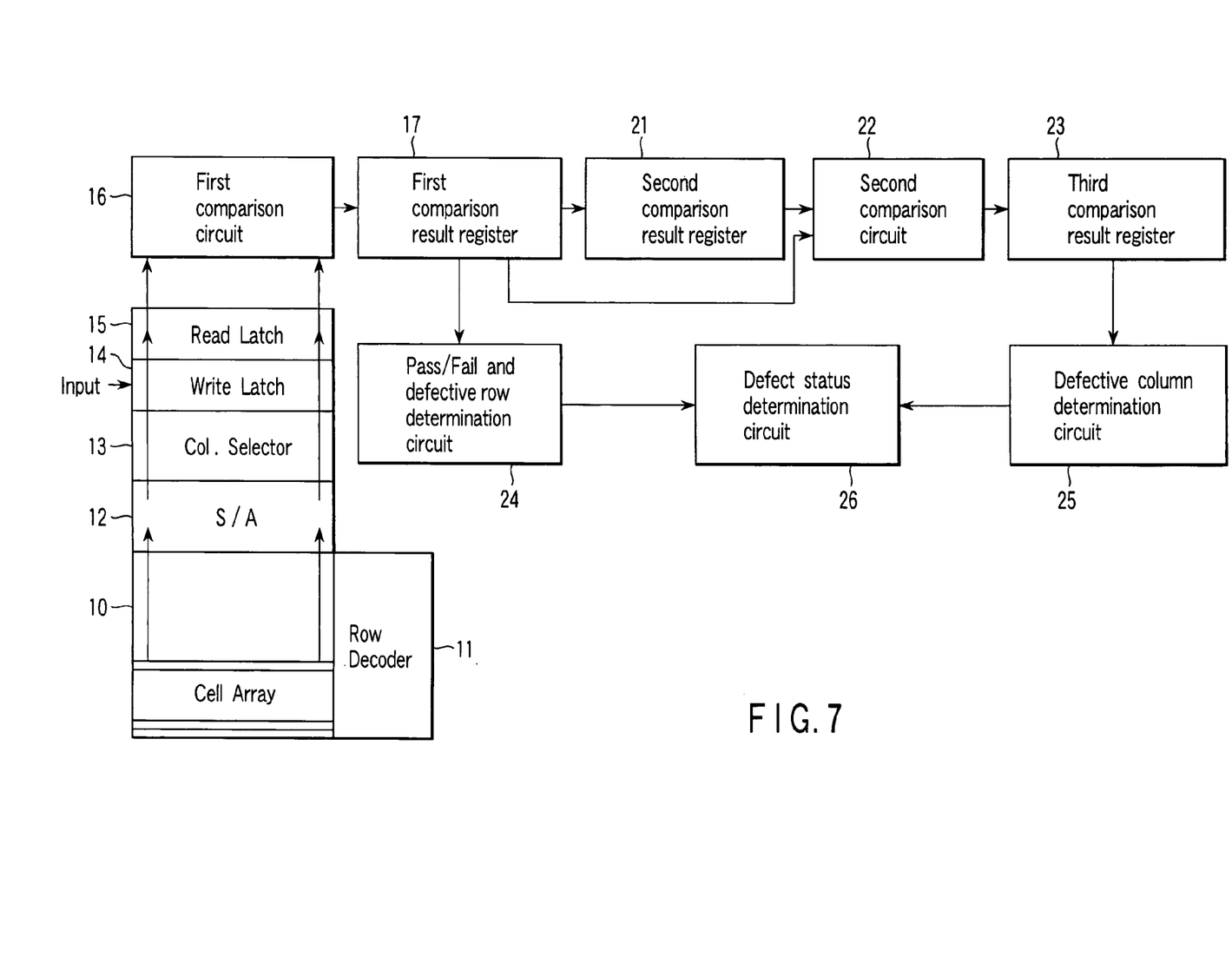
FIG. 7 is a block diagram showing part of a DRAM according to a sixth embodiment of the present invention.

FIG. 7 is a block diagram showing part of a DRAM according to a sixth embodiment of the present invention.

The DRAM of the sixth embodiment is the same as that of the first embodiment except for the following. The same components as those of the first embodiment are denoted by the same reference numerals and their descriptions are omitted.

The DRAM includes a first comparison circuit 16 for comparing data stored in the write latch circuit 14 and data stored in the read latch circuit 15 and a first comparison result register 17 for storing comparison results of the first comparison circuit 16.

In addition, the DRAM includes a second comparison result register 21, a second comparison circuit 22, a third comparison result register 23, a pass/fail (defect/defect-free) and defective row determination circuit 24, a defective column determination circuit 25, and a defect status (defective row, defective column, defective bit and defective chip) determination circuit 26.

The contents stored in the first comparison result register 17 in a test cycle are transferred to the second comparison result register 21 in the next test cycle. The second comparison circuit 21 stores the transferred contents. The second comparison circuit 22 compares the contents of the first comparison result register 17 and those of the second comparison result register 21 for each bit. The third comparison result register 23 stores a comparison result of the second comparison circuit 22.

Figure 8:
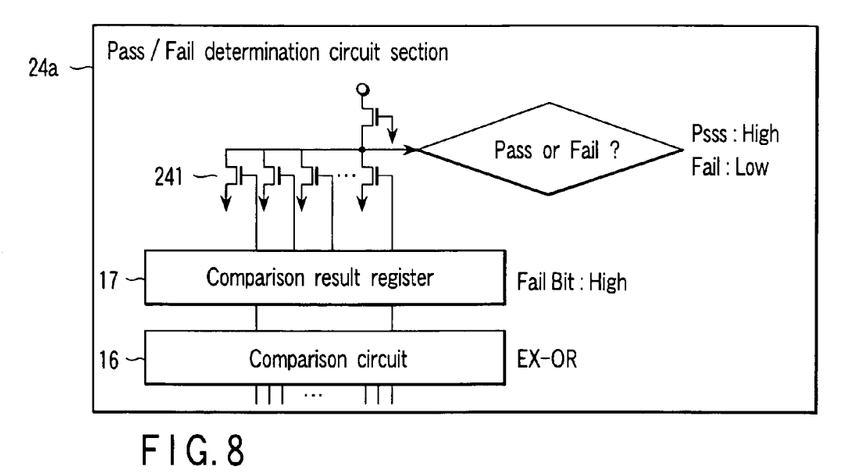
FIG. 8 is a circuit diagram showing an example of a pass/fail determination circuit of the DRAM shown in FIG. 7.

FIG. 8 shows an example of a pass/fail determination circuit section 24a of the pass/fail and defective row determination circuit 24 shown in FIG. 7. The circuit section 24a includes a NOR circuit 241. The NOR circuit 241 receives bit outputs of the first comparison result register 17, which stores comparison results (pass bit=L, fail bit=H) of the first comparison circuit 16, and outputs a pass/fail signal (pass=H, fail=L).

Figure 9:
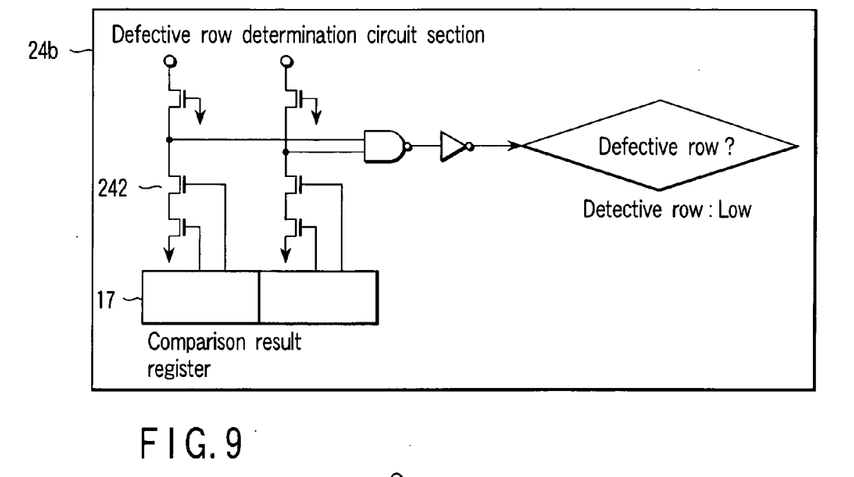
FIG. 9 is a circuit diagram showing an example of a defective row determination circuit of the DRAM shown in FIG. 7.

FIG. 9 shows an example of a defective row determination circuit section 24b of the pass/fail and defective row determination circuit 24 shown in FIG. 7. The circuit section 24b includes NAND circuits 242. The comparison results (pass bit=L, fail bit=H) stored in the first comparison result register 17 are divided into a plurality of groups (two groups in the defective row determination circuit section 24b shown in FIG. 9). Each of the NAND circuits 242 receives bit outputs of the corresponding group to detect whether the bit outputs coincide or not. Outputs of the NAND circuits 242 are checked to determine whether the outputs of the NAND circuits 242 coincide or not and thus determine whether a defective row is present or not.

Figure 10:
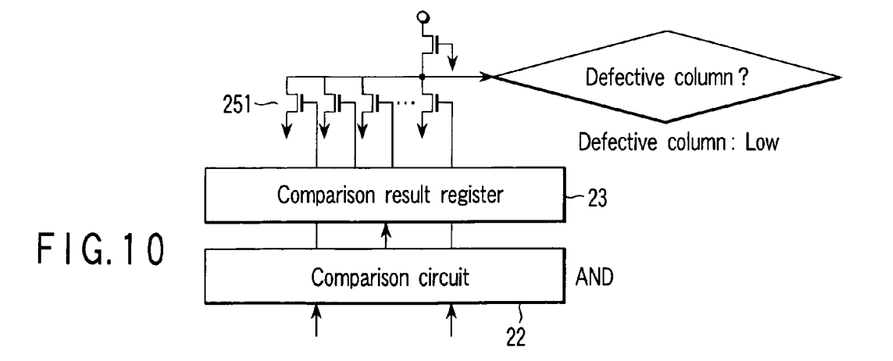
FIG. 10 is a circuit diagram showing an example of a defective column determination circuit of the DRAM shown in FIG. 7.

FIG. 10 shows an example of a defective column determination circuit section 25 shown in FIG. 7. The defective column determination circuit section 25 includes a NAND circuit 251. The NAND circuit 251 receives the comparison results (i.e., comparison results of the contents of the first comparison result register 17 and those of the second comparison result register 21 for each bit) stored in the third comparison result register 23 to determine whether a defective column is present or not.

Figure 11:
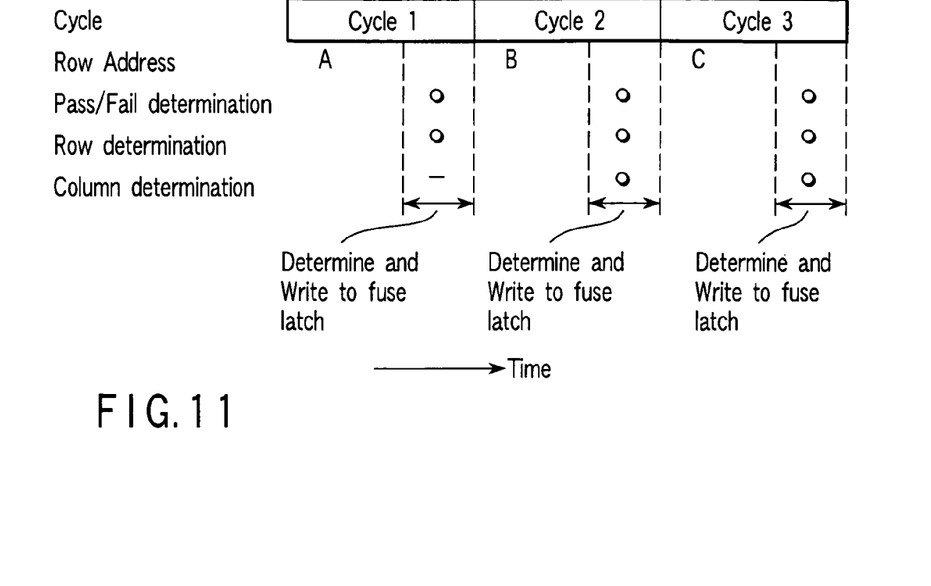
FIG. 11 is a chart showing a lapse of time required for both a determination operation performed in each test cycle by a defect status determination circuit in the DRAM shown in FIG. 7 and an operation of writing a result of the determination.

FIG. 11 shows a lapse of time required for both a determination operation performed in each test cycle by the defect status determination circuit 26 in the DRAM shown in FIG. 7 and a writing operation of writing a result of the determination.

Table 1 is for explaining a manner of determining a defect by the defect status determination circuit 26.

TABLE 1

| Pass/Fail St. | Row St. | Col. St. | Chip Status | Input to Fuse Latch |
|---|---|---|---|---|
| 1 | 1 | 1 | Pass | |
| 0 | 1 | 0 | Column defect | Column |
| 0 | 1 | 1 | Bit defect | Row |
| 0 | 0 | 0 | Chip defect | |
| 0 | 0 | 1 | Row defect | Row |

In Table 1, reference numeral 1 indicates "Pass" and reference numeral 0 indicates "Fail."

The manner shown in Table 1 is conducted by the defect status determination circuit 26 as shown in FIG. 7. The defect status determination circuit 26 determines a chip status of Pass, a defective row, a defective column, a defective bit or a defective chip, based on the chip pass/fail determination result (pass/fail Status), defective row determination result (row status) and defective column determination result (column status), and outputs results of the determination. Table 1 shows that higher priority is given to the redundancy of a defective bit than to that of a defective row.

The DRAM according to the sixth embodiment is also able to perform an operation that conforms to the above operations of the DRAM according to the first embodiment in test mode.

Operation Example 3

First, input data is written to the write latch circuit 14 and transferred to the sense amplifier 12. The data is written to the memory cell array 10 row by row.

Prior to an operation of reading data of row address A (row A) in a test cycle, the same data as the above input data is externally supplied and written to the write latch circuit 14 as comparison data. Then, data of one row (row A) selected from the memory cell array is read to the sense amplifier 12 and transferred to the read latch circuit 15.

The first comparison circuit 16 compares the contents of the write latch circuit 14 and those of the read latch circuit 15. The first comparison result register 17 stores a result of the comparison. The data of row A is divided into several data to determine whether a defective bit is present or not in the row A (whether the row is defective or not) based on the contents of the first comparison result register 17.

In the next cycle to gain access to row address B (row B), the contents of the first comparison result register 17 are transferred to the second comparison result register 21. Then, data of one row (row B) selected from the memory cell array is read to the sense amplifier 12 and transferred to the read latch circuit 15. The first comparison circuit 16 compares the contents of the write latch circuit 14 and those of the read latch circuit 15. The first comparison result register 17 stores a result of the comparison. The data of row B is divided into several data to determine whether a defective bit is present or not in the row B (whether the row is defective or not) based on the contents of the first comparison result register 17.

The second comparison circuit 22 compares the comparison result stored in the first comparison result register 17 and that stored in the second comparison result register 21 to determine whether a defective bit occurs in the same column. A result of the comparison is stored in the third comparison result register 23.

The pass/fail determination circuit section 24a (FIG. 8) of the pass/fail and defective row determination circuit 24 shown in FIG. 7 determines whether the comparison results stored in the first comparison result register 17 shows Pass or Fail and outputs a pass/fail signal (pass=H, fail=L) as a result of the determination.

The defective row determination circuit section 24b (FIG. 9) of the pass/fail and defective row determination circuit 24 shown in FIG. 7 determines whether a defective row is present or not based on the comparison results stored in the first comparison result register 17 and outputs a row status signal as a result of the determination.

The defective column determination circuit 25 determines whether a defective column is present or not based on the comparison results stored in the third comparison result register 23 and outputs a column status signal as a result of the determination.

The defect status determination circuit 26 determines a chip status of Pass, a defective row, a defective column, a defective bit and a defective chip for each test cycle based on the chip pass/fail determination result (pass/fail status), defective row determination result (row status) and defective column determination result (column status), and outputs results of the determination.

According to the above operation example 3, data of one row can be tested at once. Test time can thus greatly be reduced to 1/M (where M is the number of column addresses) that of the above-described conventional memory.

Also, according to the operation example 3, the chip status of Pass, a defective row, a defective column, a defective bit and a defective chip is determined and outputted for each test cycle.

When there is a defective bit, defective bit address information is obtained for each test cycle. A fail address memory of an external tester is unnecessary and, in other words, an external tester with no fail address memory can be used for testing.

Operation Example 4

Operation example 4 differs from operation example 3 in the following. As shown in FIG. 11, a write circuit writes defect status determination information, which is obtained from the defect status determination circuit 26, in a fuse latch circuit (not shown) for each of test cycles (cycle 1, cycle 2, cycle 3, . . . ). Storage data is read out of the fuse latch circuit and used as fuse control data to control fusing/unfusing of a fuse element (not shown) to be blown by a laser beam of a defect redundancy circuit.

Therefore, in addition to presenting substantially the same advantages as presented by the operation example 3, the operation example 4 allows redundancy of defects based on the defect status information obtained from the defect status determination circuit.

Operation Example 5

Figure 12:
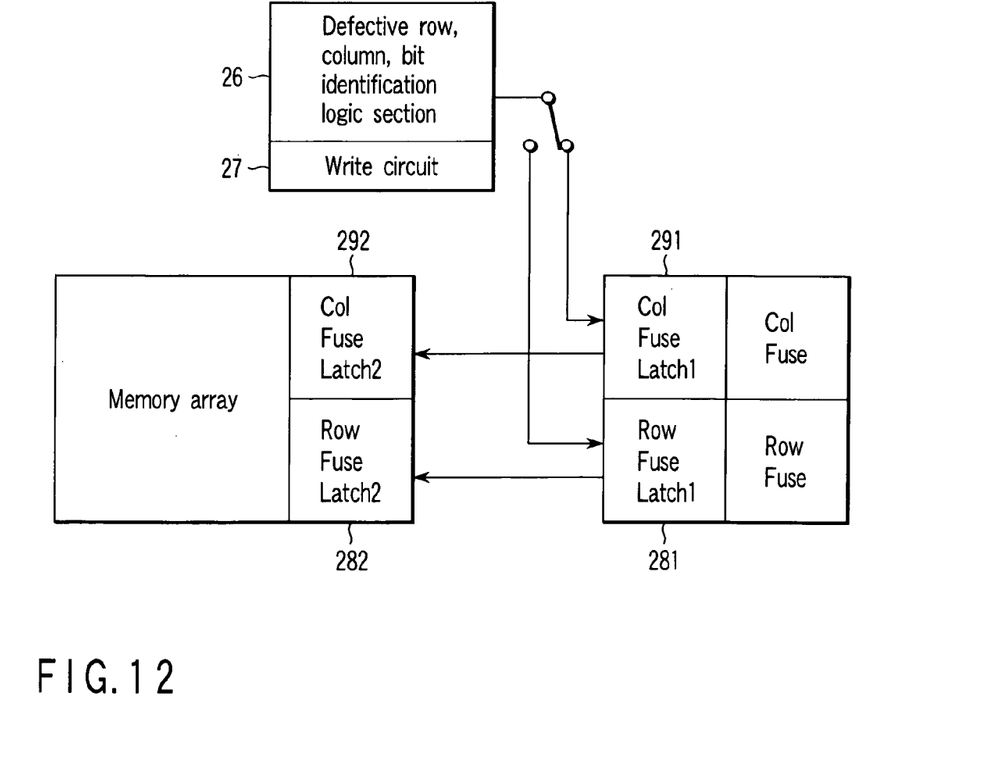
FIG. 12 is a schematic block diagram of a configuration of the DRAM according to the sixth embodiment which is required in operation example 5.

FIG. 12 schematically shows a configuration of the DRAM according to the sixth embodiment which is required in operation example 5.

In FIG. 12, reference numerals 27, 281, 291, 282 and 292 indicate a write circuit, a first row fuse latch circuit, a first column fuse latch circuit, a second row fuse latch circuit and a second column fuse latch circuit, respectively.

Referring to FIG. 12, the defective row, column, bit identification logic section (defect status determination circuit) 26 obtains defect status information and the write circuit 27 writes the status information to the first row fuse latch circuit 281 and first column fuse latch circuit 291. Storage data is read out of the circuits 281 and 291 and written to the second row fuse latch circuit 282 and second column fuse latch circuit 292. The data written to the circuits 282 and 292 is used as anti-fuse program data for turning off an electrical fuse element (not shown) of, e.g., a redundancy circuit.

Therefore, in addition to presenting substantially the same advantages as those presented by the operation example 4, the operation example 5 allows redundancy of defects based on the defect status information obtained from the defect status determination circuit.

[Seventh Embodiment]

The DRAM of the seventh embodiment differs from that of the sixth embodiment shown in FIG. 7 in the following. The comparison result registers are increased by the number of rows to be compared at once in determining whether a defective column is present or not.

Therefore, the seventh embodiment presents substantially the same advantages as those presented by the sixth embodiment. In addition, it is possible to correctly determine whether a defective column is present or not.

The other components are substantially the same as those of the sixth embodiment shown in FIG. 7 and their descriptions are omitted.

[Eighth Embodiment]

Figure 13:
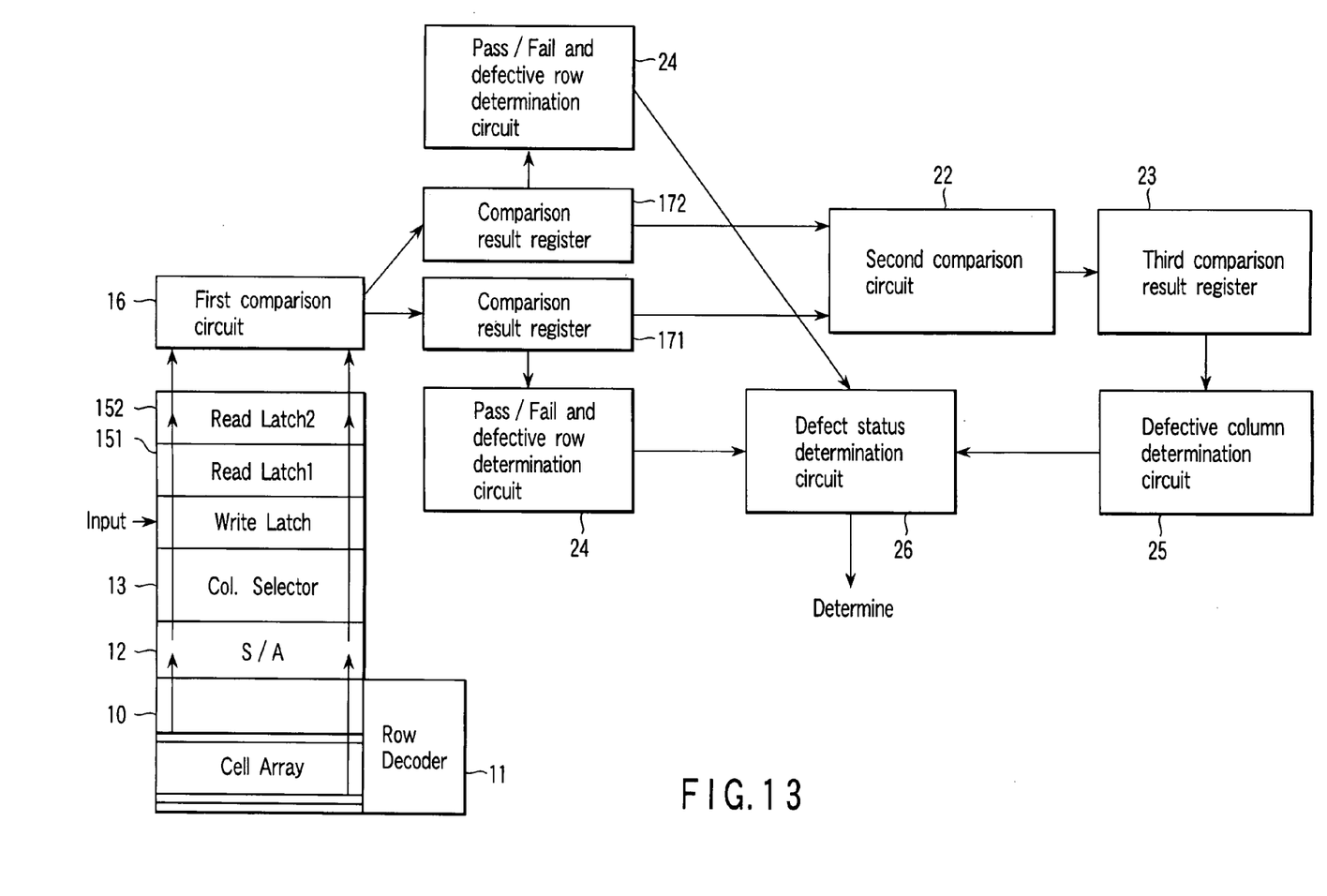
FIG. 13 is a block diagram showing part of a DRAM according to an eighth embodiment of the present invention.

FIG. 13 shows part of a DRAM according to an eighth embodiment of the present invention.

The DRAM of the eighth embodiment differs from that of the sixth embodiment shown in FIG. 7 in the following points:

1) Read data in units of row of the memory cell array is alternately stored in two read latch circuits 151 and 152. The first comparison circuit 16 compares the data of the circuit 151 and that of the circuit 152.

2) The DRAM includes a plurality of (two in the eighth embodiment) comparison result registers 171 and 172 for each of rows in the memory cell array. The registers 171 and 172 alternately store comparison results obtained from the first comparison circuit 16. The registers 171 and 72 each have a determination circuit 24 for determining whether the comparison result shows Pass or Fail and whether a defective row is present or not.

3) The second comparison circuit 22 compares the contents of the comparison result registers 171 and 172.

The same components as those of the sixth embodiment shown in FIG. 7 are denoted by the same reference numerals and their descriptions are omitted.

The comparison results obtained in units o row are alternately stored in the comparison result registers 171 and 172. Based on the contents of the comparison result registers 171 and 172, it is possible to determine whether the comparison result shows Pass or Fail and whether a defective row is present or absent and then store results of the determination in the third comparison result register 23. For example, read data of row A is stored in the comparison result register 171, read data of row B is stored in the comparison result register 172, and read data of row C et seq is stored in the registers 171 and 172 alternately.

Therefore, the eighth embodiment presents substantially the same advantages as those presented by the sixth embodiment. In addition, according to the eighth embodiment, the second comparison result register 21 is unnecessary.

[Ninth Embodiment]

Figure 14:
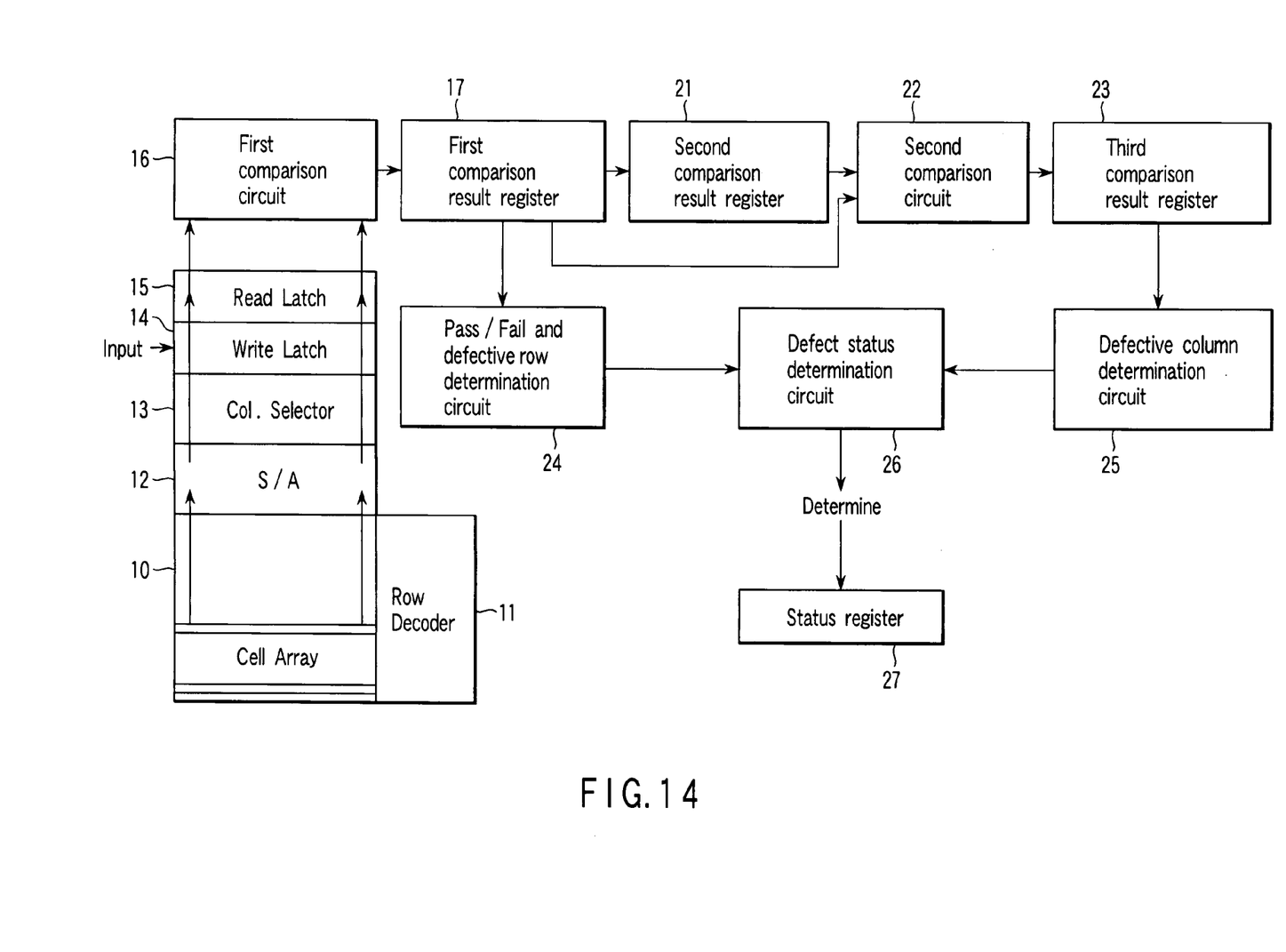
FIG. 14 is a block diagram showing part of a DRAM according to a ninth embodiment of the present invention.

FIG. 14 shows part of a DRAM according to a ninth embodiment of the present invention.

The DRAM of the ninth embodiment differs from that of the sixth embodiment shown in FIG. 7 in the following. The determination results (Pass, defective row, defective column, defective bit, defective chip) obtained from the defect status determination circuit 26 can be stored in a status register 27 and read out thereof when the need arises.

The same components as those of the sixth embodiment as shown in FIG. 7 are denoted by the same reference numerals and their descriptions are omitted.

Therefore, in addition to presenting substantially the same advantages as those presented by the sixth embodiment, the DRAM of the ninth embodiment makes it possible to output determination results (Pass, defective row, defective column, defective bit, defective chip) obtained from the defect status determination circuit 26.

[Tenth Embodiment]

Figure 15:
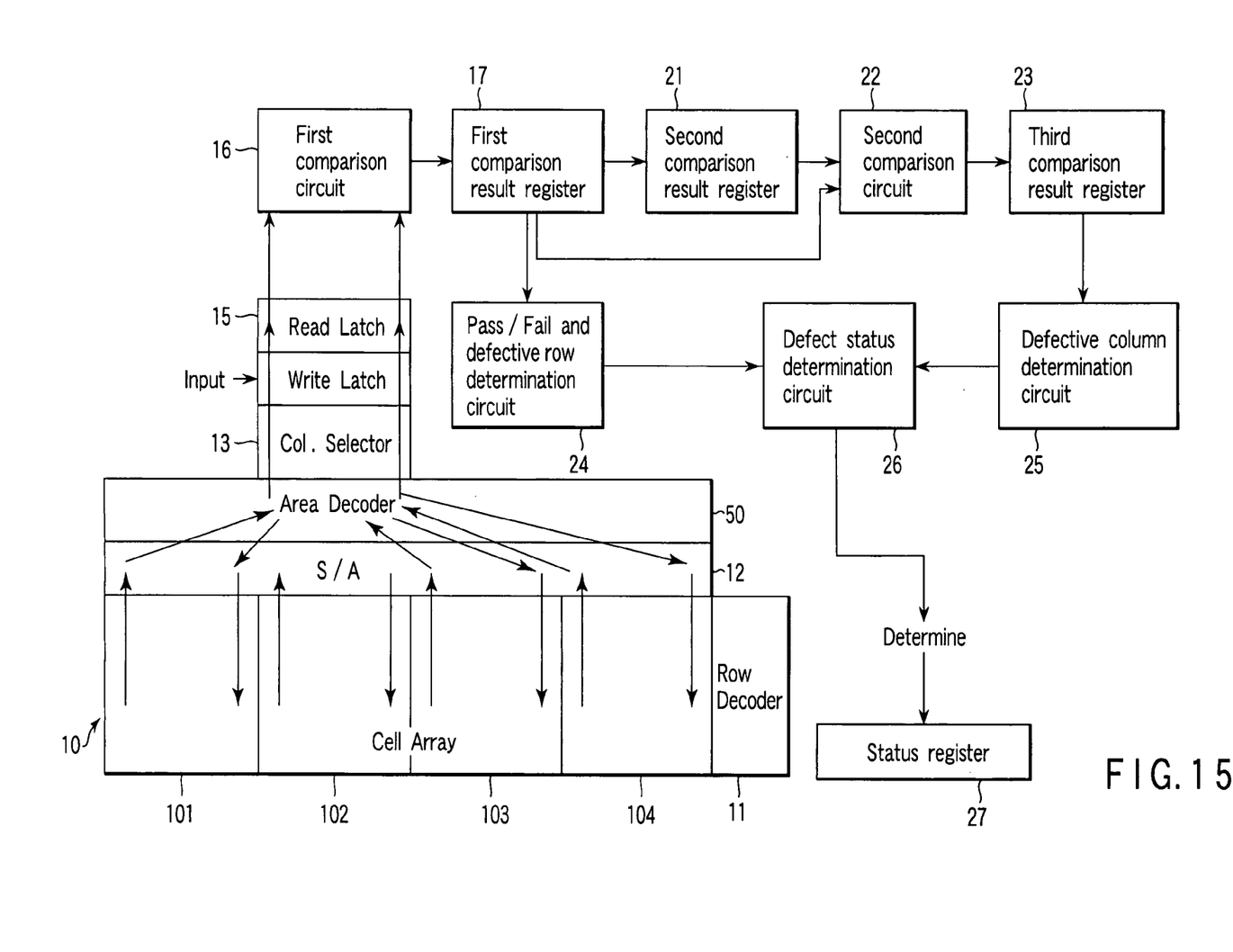
FIG. 15 is a block diagram showing part of a DRAM according to a tenth embodiment of the present invention.

FIG. 15 shows part of a DRAM according to a tenth embodiment of the present invention.

The DRAM of the tenth embodiment differs from that of the sixth embodiment shown in FIG. 7 in the following points. The memory cell array 10 is divided into n sub-cell arrays 101 to 104 (n is a positive integer). The number of write latch circuits 14, that of read latch circuits 15 and that of comparison circuits 16 are each equal to 1/n that of sense amplifiers 12. The DRAM includes an area decoder 50 for selecting a sub-cell array. However, the DRAM of the tenth embodiment is the same as that of the sixth embodiment in that the number of sense amplifiers 12 is equal to that of columns of the memory cell array 10. The same components as those of the sixth embodiment are denoted by the same reference numerals and their descriptions are omitted.

The write latch circuit 14 stores input data externally supplied and, in test mode, sets data for one row of the sub-cell array selected by the area decoder 50 in the sense amplifier 12 corresponding to the selected sub-cell array. The read latch circuit 15 stores, in test mode, data of one row read out to the sense amplifier 12 from the corresponding sub-cell array selected by the area decoder 50. After the test of data for the row is completed, it is determined whether the row is defective or not.

The DRAM according to the tenth embodiment is also able to perform an operation that conforms to the above operations of the DRAM according to the sixth embodiment in test mode.

Therefore, in addition to presenting substantially the same advantages as those presented by the sixth embodiment, the DRAM of the tenth embodiment makes it possible to reduce the number of write latch circuits 14, that of read latch circuits 15 and that of comparison circuits 16.

According to the above embodiments, a semiconductor memory device is provided which is capable of reducing the number of addresses to be tested and shortening test time and a method of testing the device. Furthermore, a semiconductor memory device is provided which is capable of automatically determining the contents of a defect in a chip for each test cycle when the defect is detected in the test and replacing the defect with a cell of a redundancy circuit and a method of testing the device. The embodiments of the present invention are not limited to the DRAM described above but can be applied to another memory such as an SRAM.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a memory cell array including memory cells arranged in rows and columns;
    a word line connected in common to memory cells in each of rows of the memory cell array;
    a bit line connected in common to memory cells in each of columns of the memory cell array;
    a row decoder and a column decoder configured to select a row and a column of the memory cell array;
    a sense amplifier provided for each of the columns of the memory cell array;
    a write latch circuit configured to store externally input data and sets data of one row of the memory cell array in the sense amplifiers in test mode;
    a read latch circuit configured to store data of one row, which is read from the memory cell array and set in the sense amplifiers in test mode;
    a first comparison circuit configured to compare the data stored in the write latch circuit and the data stored in the read latch circuit; and
    a first comparison result register configured to store a comparison result of the first comparison circuit.

2. The semiconductor memory device according to claim 1, wherein the sense amplifier, the write latch circuit and the read latch circuit are provided for each of the columns of the memory cell array.

3. The semiconductor memory device according to claim 1, further comprising:
    a second comparison result register configured to store the comparison result register which is transferred from the first comparison result at a test cycle, the contents being stored in the first comparison result register at a preceding cycle;
    a second comparison circuit configured to compare the contents of the first comparison result register and those of the second comparison result register;
    a third comparison result register configured to store a comparison result of the second comparison circuit;
    a defective row determination circuit configured to determine according to the contents of the first comparison result register whether a defective row of the memory cell array is present or not;
    a defective column determination circuit configured to determine according to the contents of the second comparison result register whether a defective column of the memory cell array is present or not; and
    a defect status determination circuit configured to determine a chip status of a defective row, a defective column, a defective bit and a defective chip according to determination results of the defective row determination circuit and the defective column determination circuit.

4. The semiconductor memory device according to claim 3, further comprising a fuse control circuit configured to write determination information obtained by the defect status determination circuit in a fuse latch circuit for each test cycle, and read data from the fuse latch circuit and use the data read from the fuse latch circuit as fuse data for controlling blow/non-blow of an electrical fuse element of a redundancy circuit.

5. The semiconductor memory device according to claim 3, further comprising a fuse control circuit configured to write determination information obtained by the defect status determination circuit in a first fuse latch circuit for each test cycle, read data from the first fuse latch circuit and write the data in a second fuse latch circuit, and read data from the second fuse latch circuit and use the data read from the second fuse latch circuit as fuse data for controlling blow/non-blow of an electrical fuse element of a redundancy circuit.

6. The semiconductor memory device according to claim 3, wherein a plurality of data comparison result registers are provided, the number of data comparison result registers being equal to that of columns to be compared at once, and contents of the plurality of data comparison result registers are compared with each other to determine whether a defective column is present or not.

7. The semiconductor memory device according to claim 3, further comprising a determination circuit configured to alternately store in units of row the comparison results obtained by the first comparison circuit in a plurality of comparison result registers, and determine Pass or Fail and determine whether a defective row is present or not, according to the contents of the comparison results.

8. The semiconductor memory device according to claim 3, further comprising a status register configured to store the determination result obtained by the defect status determination circuit, the determination results being read out when need arises.

9. The semiconductor memory device according to claim 1, wherein the memory cell array is divided into n sub-cell arrays (n is a positive integer), and the number of the write latch circuits, that of the read latch circuits and that of the comparison circuits are each equal to 1/n that of the sense amplifiers.

10. A semiconductor memory device comprising:
a memory cell array including memory cells arranged in rows and columns;
a word line connected in common to memory cells in each of rows of the memory cell array;
a bit line connected in common to memory cells in each of columns of the memory cell array;
a row decoder and a column decoder configured to select a row and a column of the memory cell array;
a sense amplifier provided for each of the columns of the memory cell array;
a storage unit arranged in the memory cell array and configured to store pattern data the bit number of which is equal to that of the sense amplifiers;
a pattern selecting decoder configured to select one of the pattern data stored in the storage unit in test mode;
a write latch circuit configured to store the pattern data selected by the pattern selecting decoder and sets the pattern data in the sense amplifiers in test mode as one row of the memory cell array;
a read latch circuit configured to store data of one row, which is read from the memory cell array and set in the sense amplifiers in test mode;
a first comparison circuit configured to compare the data stored in the write latch circuit and the data stored in the read latch circuit; and
a first comparison result register configured to store a comparison result of the first comparison circuit.

11. The semiconductor memory device according to claim 10, wherein the storage unit comprises a ROM.

12. The semiconductor memory device according to claim 10, wherein the storage unit and the pattern selecting decoder are provided outside the memory cell array.

13. The semiconductor memory device according to claim 10, wherein the storage unit is provided outside the memory cell array and comprises a RAM in which a plurality of pattern data are rewritable.

14. The semiconductor memory device according to claim 10, wherein the sense amplifier, the write latch circuit and the read latch circuit are provided for each of the columns of the memory cell array.

15. The semiconductor memory device according to claim 10, further comprising:
a second comparison result register configured to store the comparison result which is transferred from the first comparison result at a test cycle, the contents being stored in the first comparison result register at a preceding cycle;
a second comparison circuit configured to compare the contents of the first comparison result register and those of the second comparison result register;
a third comparison result register configured to store a comparison result of the second comparison circuit;
a defective row determination circuit configured to determine according to the contents of the first comparison result register whether a defective row of the memory cell array is present or not;
a defective column determination circuit configured to determine according to the contents of the second comparison result register whether a defective column of the memory cell array is present or not; and
a defect status determination circuit configured to determine a chip status of a defective row, a defective column, a defective bit and a defective chip according to determination results of the defective row determination circuit and the defective column determination circuit.

16. The semiconductor memory device according to claim 15, further comprising a fuse control circuit configured to write determination information obtained by the defect status determination circuit in a fuse latch circuit for each test cycle, and read data from the fuse latch circuit and use the data read from the fuse latch circuit as fuse data for controlling blow/non-blow of an electrical fuse element of a redundancy circuit.

17. The semiconductor memory device according to claim 15, further comprising a fuse control circuit configured to write determination information obtained by the defect status determination circuit in a first fuse latch circuit for each test cycle, read data from the first fuse latch circuit and write the data in a second fuse latch circuit, and read data from the second fuse latch circuit and use the data read from the second fuse latch circuit as fuse data for controlling blow/non-blow of an electrical fuse element of a redundancy circuit.

18. The semiconductor memory device according to claim 15, wherein a plurality of data comparison result registers are provided, the number of data comparison result registers being equal to that of columns to be compared at once, and contents of the plurality of data comparison result registers are compared with each other to determine whether a defective column is present or not.

19. The semiconductor memory device according to claim 15, further comprising a determination circuit configured to alternately store in units of row the comparison results obtained by the first comparison circuit in a plurality of comparison result registers, and determine Pass or Fail and determine whether a defective row is present or not, according to the contents of the comparison results.

20. The semiconductor memory device according to claim 15, further comprising a status register configured to store the determination result obtained by the defect status determination circuit, and the determination results being read out when need arises.

21. The semiconductor memory device according to claim 10, wherein the memory cell array is divided into n sub-cell arrays (n is a positive integer), and the number of the write latch circuits, that of the read latch circuits and that of the comparison circuits are each equal to 1/n that of the sense amplifiers.

22. A method of testing a semiconductor memory device, comprising:
   writing input data to a write latch circuit, transferring the data to a sense amplifier from the write latch circuit, and writing the data to a memory cell array row by row, the memory cell array including memory cells arranged in rows and columns;
   retaining the data written in the write latch circuit as it is or rewriting the data in the write latch circuit to an externally inputted data, reading data from the memory cell array row by row to the sense amplifier, and transferring the data read to the sense amplifier to a read latch circuit;
   comparing the data of the read latch circuit and the data of the write latch circuit by a first comparison circuit and storing a comparison result in a first comparison register;
   transferring contents stored in the first comparison result register in a test cycle to a second comparison result register in a next test cycle;
   comparing the comparison result stored in the first comparison result register and the comparison result stored in the second comparison result register by a second comparison circuit and storing a comparison result in a third comparison result register; and
   determining whether a defective row is present or not in the memory cell array based on the contents of the first comparison result register and determining whether a defective column is present or not in the memory cell array based on the contents of the second comparison result register.

* * * * *